(12) United States Patent
Kathan et al.

(10) Patent No.: US 11,493,370 B2
(45) Date of Patent: Nov. 8, 2022

(54) AUTOMATIC CALIBRATION OF CONTACT SENSOR

(71) Applicant: Nortek Security & Control LLC, Carlsbad, CA (US)

(72) Inventors: Sivakumar Kathan, Oceanside, CA (US); Dustin Mitchell, Vista, CA (US); Stephen McClure, Ramona, CA (US)

(73) Assignee: Nortek Security & Control LLC, Carlsbad, CA (US)

( * ) Notice: Subject to any disclaimer, the term of this patent is extended or adjusted under 35 U.S.C. 154(b) by 513 days.

(21) Appl. No.: 16/277,471

(22) Filed: Feb. 15, 2019

(65) Prior Publication Data

US 2020/0264019 A1   Aug. 20, 2020

(51) Int. Cl.
*G01D 18/00* (2006.01)
*G01R 33/00* (2006.01)
*G01D 5/12* (2006.01)

(52) U.S. Cl.
CPC .............. *G01D 18/00* (2013.01); *G01D 5/12* (2013.01); *G01R 33/0035* (2013.01)

(58) Field of Classification Search
CPC .. E06B 3/485; E06B 7/28; G01C 5/06; G01C 9/00; G01P 15/00; G01H 1/00; G01D 5/12; G01D 18/00; G01R 33/0035
See application file for complete search history.

(56) References Cited

U.S. PATENT DOCUMENTS

| 6,651,003 | B2 | 11/2003 | Woloszyk et al. |
| 8,773,237 | B2 | 7/2014 | Burris et al. |
| 9,695,616 | B2 | 7/2017 | Johnson et al. |
| 9,721,413 | B2 | 8/2017 | Dumas et al. |
| 9,790,736 | B2 | 10/2017 | Kincaid et al. |
| 9,830,785 | B2 | 11/2017 | Modi et al. |
| 9,933,243 | B2 | 4/2018 | Thibault et al. |

(Continued)

FOREIGN PATENT DOCUMENTS

WO   WO-2018055398 A1   3/2018

OTHER PUBLICATIONS

Dorveaux, Eric, et al., "On-the-field calibration of an array of sensors", HAL Id: hal-00525783, [Online] Retrieved from the Internet: <URL: https://hal-mines-paristech.archives-ouvertes.fr/hal-00525783>, (2010), 9 pgs.

(Continued)

*Primary Examiner* — Lee E Rodak
*Assistant Examiner* — Brent J Andrews
(74) *Attorney, Agent, or Firm* — Schwegman Lundberg & Woessner, P.A.

(57) ABSTRACT

A method for calibrating a device is described. The device accesses magnetometer data of a magnetometer sensor in the device, and accelerometer data of an accelerometer sensor in the device. The device determines a first position and a second position of the device based on the magnetometer data and the accelerometer data. The device determines a first magnetic vector based on the magnetometer data at the first position of the device, and a second magnetic vector based on the magnetometer data at the second position of the device. The device then assigns the first magnetic vector to the first position of the device, and the second magnetic vector to the second position of the device.

20 Claims, 18 Drawing Sheets

(56) References Cited

U.S. PATENT DOCUMENTS

| | | | |
|---|---|---|---|
| 9,953,503 B2 | 4/2018 | Smith | |
| 9,982,459 B2 | 5/2018 | Telljohann et al. | |
| 10,089,851 B1* | 10/2018 | Singh | G08B 29/183 |
| 2017/0193724 A1 | 7/2017 | Johnson et al. | |
| 2018/0031604 A1 | 2/2018 | Chennakeshu et al. | |
| 2018/0180413 A1* | 6/2018 | Singh | E06B 3/485 |

OTHER PUBLICATIONS

Frank, Kevin, et al., "Finding the Probability of Doors Being Open Using a Continuous Position Logger", Fire Safety Science—Proceedings of the 11th International Symposium, International Association for Fire Safety Science, (2014), 969-982.

Kok, Manon, "Probabilistic modeling for sensor fusion with inertial measurements", Linköping studies in science and technology. Dissertations. No. 1814, LiU-Tryck, SE, (2016), 74 pgs.

Suh Soo Young, et al., "Indoor Magnetic Signature Based Localization Algorithm without Person-Dependent Parameter Calibration", Sensors 14, (2014), 14375-14398.

Voigt, Josefin, "Angular positioning of a door or window—using MEMS accelerometer and a magnetometer", Master's Thesis in Electrical Measurements at Lund University, SE, (2015), 119 pgs.

\* cited by examiner

AUTOMATIC CALIBRATION OF CONTACT SENSOR

BACKGROUND

Door and window sensors that operate using a magnetic switch require calibration. An installer of a security system will typically adjust a mounting position of the magnet or sensor on a door (in a closed position) until the magnet is detected by the reed switch. The calibration of the sensor further depends on the different types of frames and barrier opening types (e.g., sliding, swinging).

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
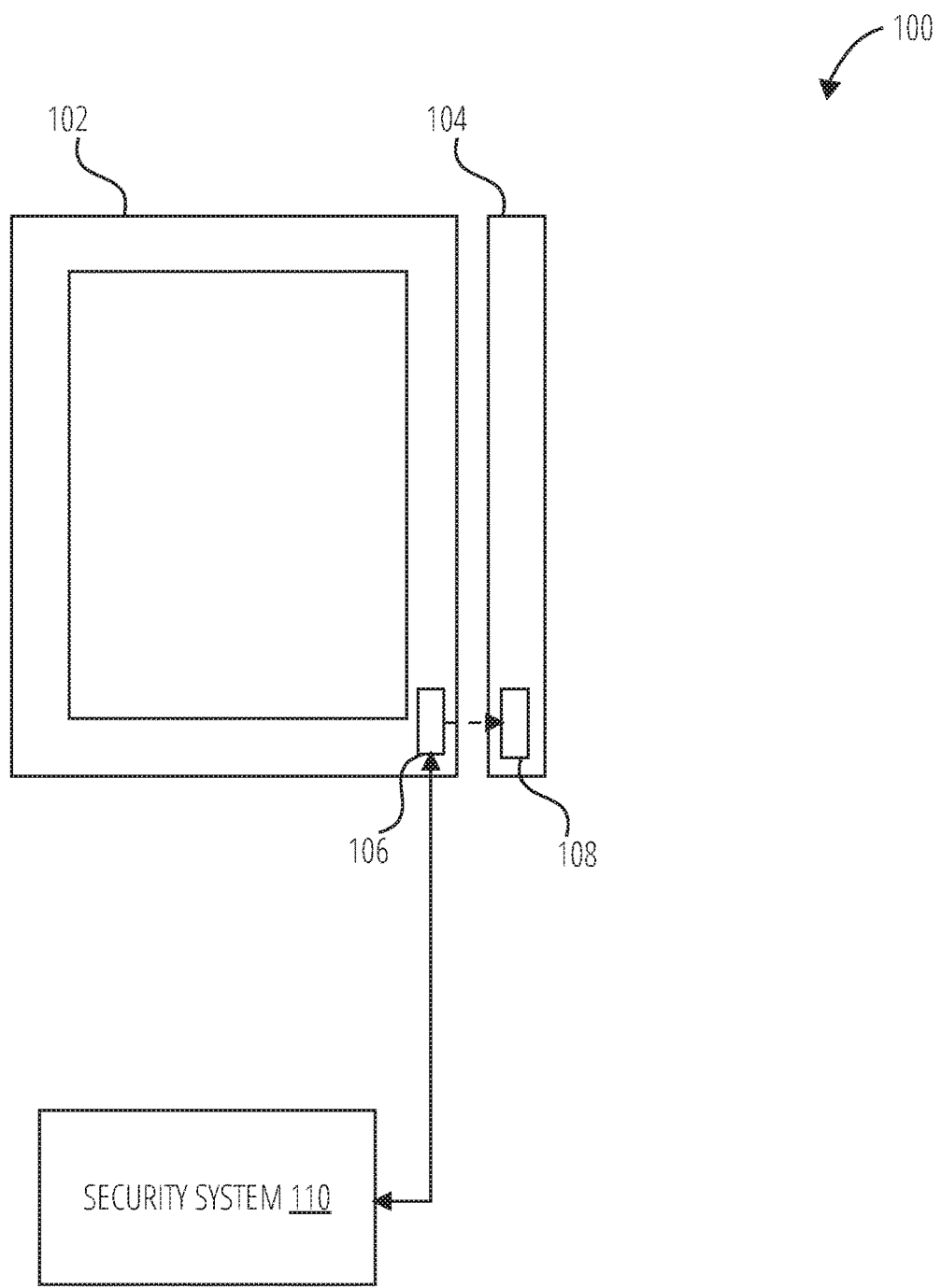
FIG. 1 illustrates a barrier in a closed position in accordance with one example embodiment.

"Component" refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor or other programmable processor. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some example embodiments, the processors or processor-implemented components may be located in a single geographic location (e.g., within a home environment, an office environment, or a server farm). In other example embodiments, the processors or processor-implemented components may be distributed across a number of geographic locations.

"Communication Network" refers to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology.

"Machine-Storage Medium" refers to a single or multiple storage devices and/or media (e.g., a centralized or distributed database, and/or associated caches and servers) that store executable instructions, routines and/or data. The term shall accordingly be taken to include, but not be limited to, solid-state memories, and optical and magnetic media, including memory internal or external to processors. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Processor" refers to any circuit or virtual circuit (a physical circuit emulated by logic executing on an actual processor) that manipulates data values according to control signals (e.g., "commands", "op codes", "machine code", etc.) and which produces corresponding output signals that are applied to operate a machine. A processor may, for example, be a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC) or any combination thereof. A processor may further be a multi-core processor having two or more independent processors (sometimes referred to as "cores") that may execute instructions contemporaneously.

"Carrier Signal" refers to any intangible medium that is capable of storing, encoding, or carrying instructions for execution by the machine, and includes digital or analog communications signals or other intangible media to facilitate communication of such instructions. Instructions may be transmitted or received over a network using a transmission medium via a network interface device.

"Signal Medium" refers to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"Computer-Readable Medium" refers to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

When installing the proposed sensor (that has accelerometer and magnetometer), you do not have to teach the sensor on the open and closed positions. It will self-calibrate the positions based on the accelerometer and magnetometer data. In one example, the contact sensor (of a security system), when powers up for the first time reads the magnetic field and records the vector. The security sensor then looks for a swing or sliding motion based on the accelerometer data. It is normally expected to have a low to medium shock when a door/window is closed. The accelerometer detects this event and the sensor will store both accelerometer and magnetometer vector values. The user opens and closes the door/window a few times. A history of these three input readings (e.g., acceleration data, magnetic field data) is stored in a storage device. An analysis of the historical data determines the typical open and closed positions.

In one example embodiment, a system and method for calibrating a device is described. The device accesses magnetometer data of a magnetometer sensor in the device, and accelerometer data of an accelerometer sensor in the device. The device determines a first position and a second position of the device based on the magnetometer data and the accelerometer data. The device determines a first magnetic vector based on the magnetometer data at the first position of the device, and a second magnetic vector based on the magnetometer data at the second position of the device. The device then assigns the first magnetic vector to the first position of the device, and the second magnetic vector to the second position of the device.

FIG. 1 illustrates a security environment in accordance with one example embodiment. FIG. 1 is a diagram illustrating a sensor device 106 mounted to a window 102. The window 102 is illustrated in a closed position in FIG. 1. A magnet 108 is mounted to a frame 104 adjacent to the window 102. The magnet 108 forms a magnetic field that is picked up by the sensor device 106. The sensor device 106 is coupled (e.g., wired or wirelessly) to a security system 110. The sensor device 106 measures the magnetic field produced by the magnet 108 to form a magnetic vector. The sensor device 106 determines a status (e.g., close or open position) of the sensor device 106 based on the magnetic vector and accelerometer data of the sensor device 106. The sensor device 106 communicates the status to the security system 110.

Figure 2:
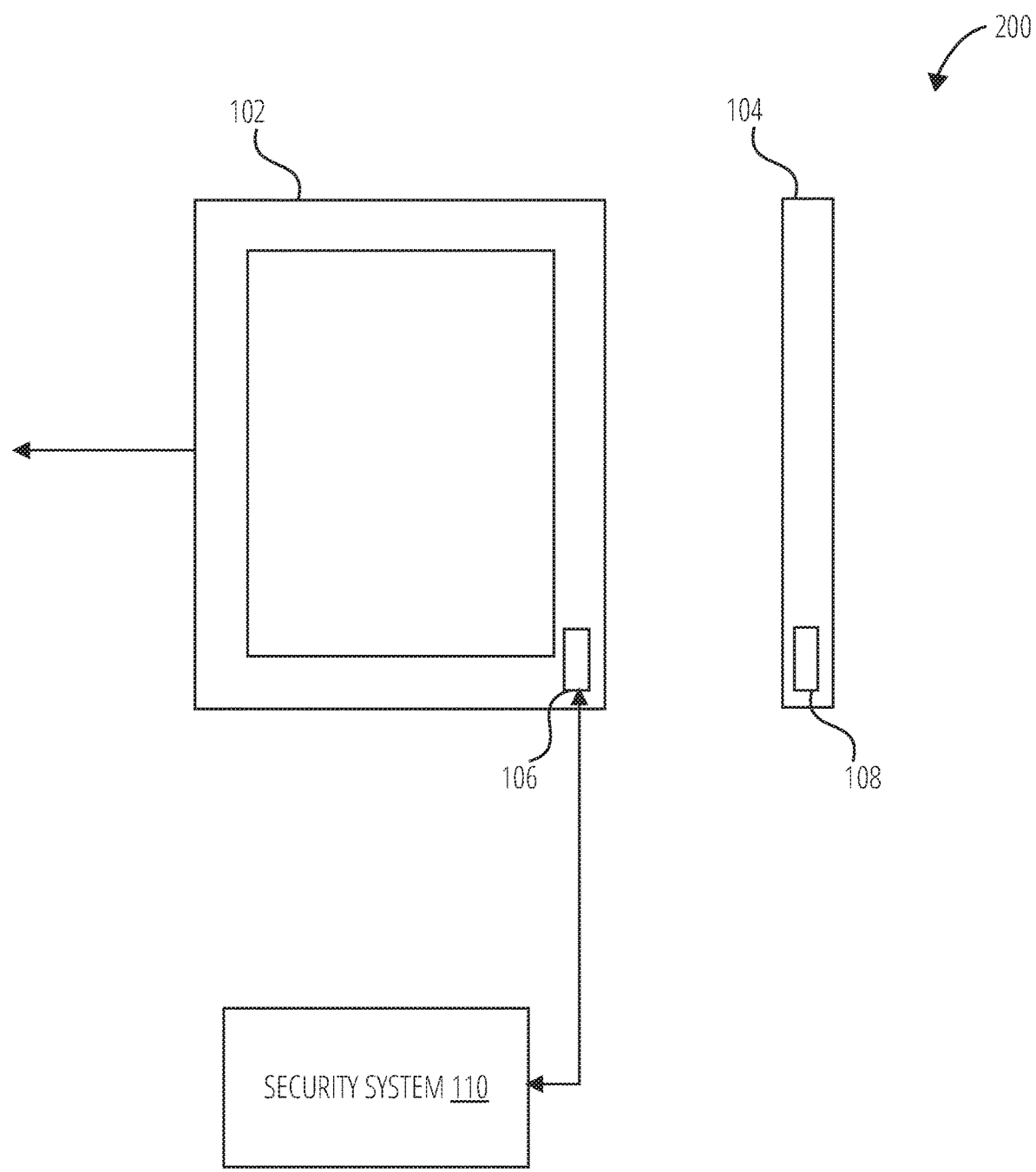
FIG. 2 illustrates a barrier in an open position in accordance with one example embodiment.

FIG. 2 illustrates a security environment in accordance with one example embodiment. The window 102 is illustrated in an open position in FIG. 2. The window 102 is moved away from the frame 104 along an axis (e.g., the window 102 slides open). The sensor device 106 detects a change in the acceleration and magnetic field. The sensor device 106 determines whether the window 102 is open or closed based on the updated magnetic field and accelerometer data.

Figure 3:
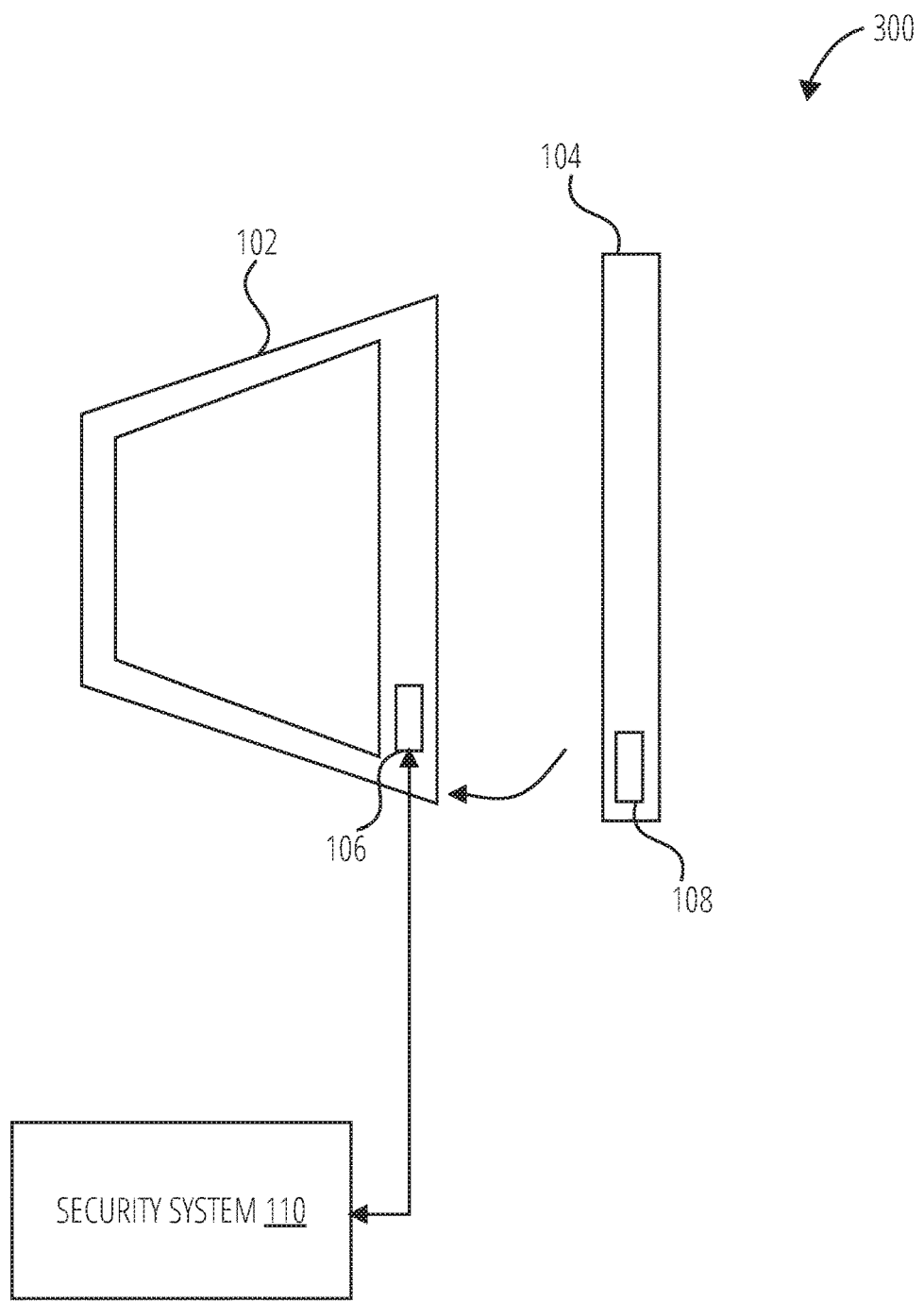
FIG. 3 illustrates a barrier in an open position in accordance with another example embodiment.

FIG. 3 illustrates a security environment in accordance with one example embodiment. The window 102 is illustrated in an open position in FIG. 2. The window 102 rotates and swings into an open position. The sensor device 106 detects a change in the magnetic field. The sensor device 106 determines whether the window 102 is open or closed based on the updated magnetic field and accelerometer data.

Figure 4:
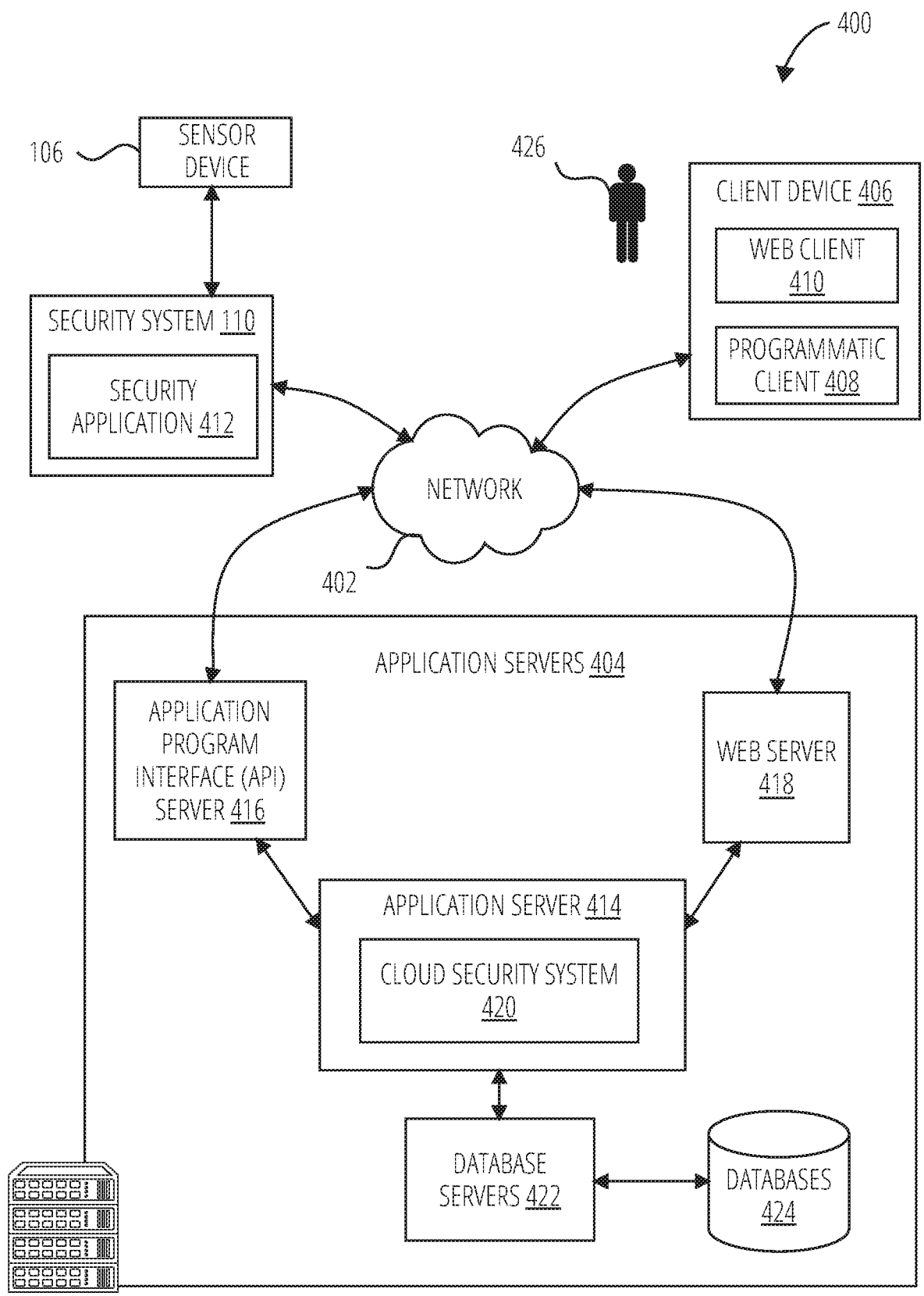
FIG. 4 is a diagrammatic representation of a networked environment in which the present disclosure may be deployed, in accordance with some example embodiments.

FIG. 4 is a diagrammatic representation of a network environment 400 in which some example embodiments of the present disclosure may be implemented or deployed. One or more application servers 404 provide server-side functionality via a network 402 to a networked user device, in the form of a client device 110. A web client 410 (e.g., a browser) and a programmatic client 408 (e.g., an "app") are hosted and execute on the web client 410.

An Application Program Interface (API) server 416 and a web server 418 provide respective programmatic and web interfaces to application servers 404. A specific application server 414 hosts a cloud security system 420, which includes components, modules and/or applications.

The web client 410 communicates with the cloud security system 420 via the web interface supported by the web server 418. Similarly, the programmatic client 408 communicates with the cloud security system 420 via the programmatic interface provided by the Application Program Interface (API) server 416.

The cloud security system 420 may also, for example, communicate with a security application 412 at the security system 110. The security system 110 may be located at a home or business. The sensor device 106 monitors a window or door at the home or business. The sensor device 106 communicates with the security system 110.

The application server 414 is shown to be communicatively coupled to database servers 422 that facilitates access to an information storage repository or databases 424. In an example embodiment, the databases 424 includes storage devices that store information to be published and/or processed by the cloud security system 420.

Additionally, the security application 412 executing on the security system 110, is shown as having programmatic access to the application server 414 via the programmatic interface provided by the Application Program Interface (API) server 416. For example, the security application 412, using information retrieved from the application server 414, may supports one or more features or functions on a website hosted by the third party.

Any of the systems or machines (e.g., databases, devices, servers) shown in, or associated with, FIG. 4 may be, include, or otherwise be implemented in a special-purpose (e.g., specialized or otherwise non-generic) computer that has been modified (e.g., configured or programmed by software, such as one or more software modules of an application, operating system, firmware, middleware, or other program) to perform one or more of the functions described herein for that system or machine. For example, a special-purpose computer system able to implement any one or more of the methodologies described herein is discussed below with respect to FIG. 18, and such a special-purpose computer may accordingly be a means for performing any one or more of the methodologies discussed herein. Within the technical field of such special-purpose computers, a special-purpose computer that has been modified by the structures discussed herein to perform the functions discussed herein is technically improved compared to other special-purpose computers that lack the structures discussed herein or are otherwise unable to perform the functions discussed herein. Accordingly, a special-purpose machine configured according to the systems and methods discussed herein provides an improvement to the technology of similar special-purpose machines.

Moreover, any two or more of the systems or machines illustrated in FIG. 4 may be combined into a single system or machine, and the functions described herein for any single system or machine may be subdivided among multiple systems or machines. Additionally, any number and types of client device 406 may be embodied within the network environment 400. Furthermore, some components or functions of the network environment 400 may be combined or located elsewhere in the network environment 400. For example, some of the functions of the client device 406 may be embodied at the application server 414.

Figure 5:
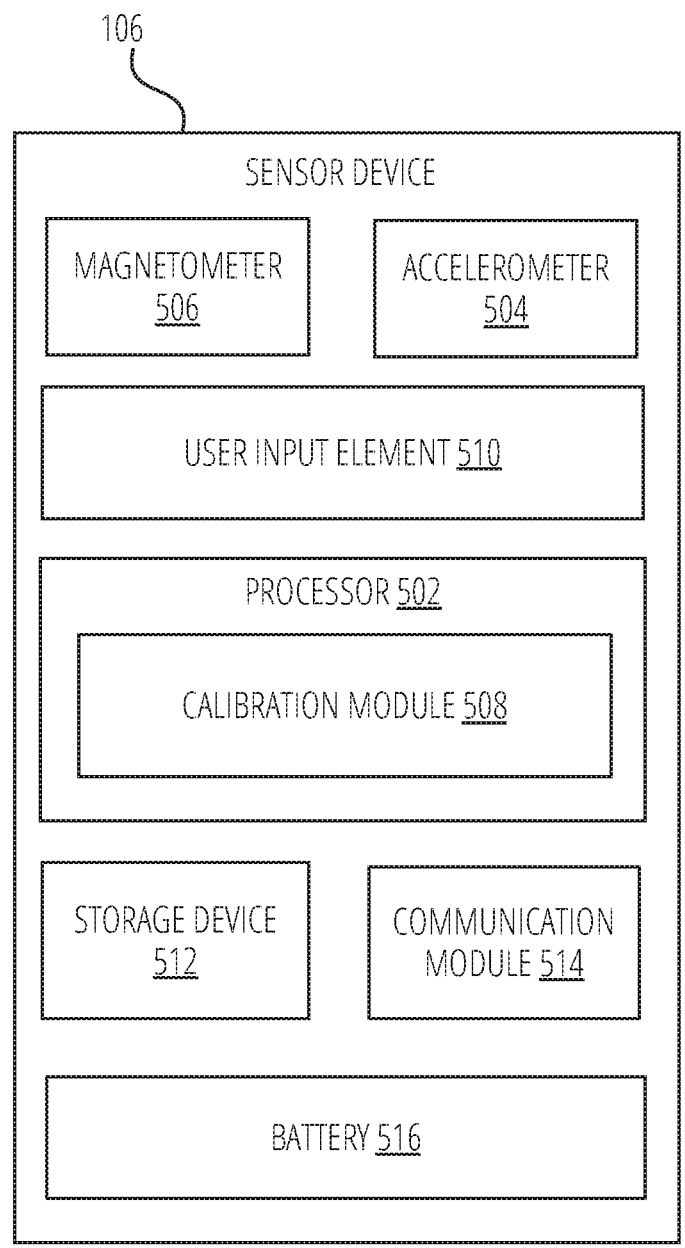
FIG. 5 illustrates a sensor device in accordance with one example embodiment.

FIG. 5 illustrates a sensor device in accordance with one example embodiment. The sensor device 106 includes a magnetometer 506, an accelerometer 504, a user input element 510, a processor 502, a storage device 512, a communication module 514, and a battery 516. The magnetometer 506 measures the magnetic field relative to the sensor device 106. In one example embodiment, the magnetometer 506 generates magnetometer sensor data representing the detected magnetic field at the sensor device 106. The accelerometer 504 measures an acceleration of the sensor device 106. The user input element 510 includes, for example, a physical button or any other user input to trigger or set the sensor device 106 into a calibration mode. The storage device 512 stores the magnetometer data from the magnetometer 506 and acceleration data from the accelerometer 504. The communication module 514 is configured to communicate with the security system 110.

In one example embodiment, the processor 502 includes a calibration module 508. The calibration module 508 determines whether the sensor device 106 is in an open or close position based on the magnetometer data and the accelerometer data. In one example, the calibration module 508 calibrates the sensor device 106 to the open and close position based on the magnetometer data and the accelerometer data. For example, an installer may open and close the window 102 a few times to log the magnetometer data and the accelerometer data into the storage device 512. The calibration module 508 analyzes the historical data to determine magnetic vectors associated with a close position of the window 102, and magnetic vectors associated with an open position of the window 102. Examples operations of the calibration module 508 are described further below with respect to FIG. 7 to FIG. 14.

Figure 6:
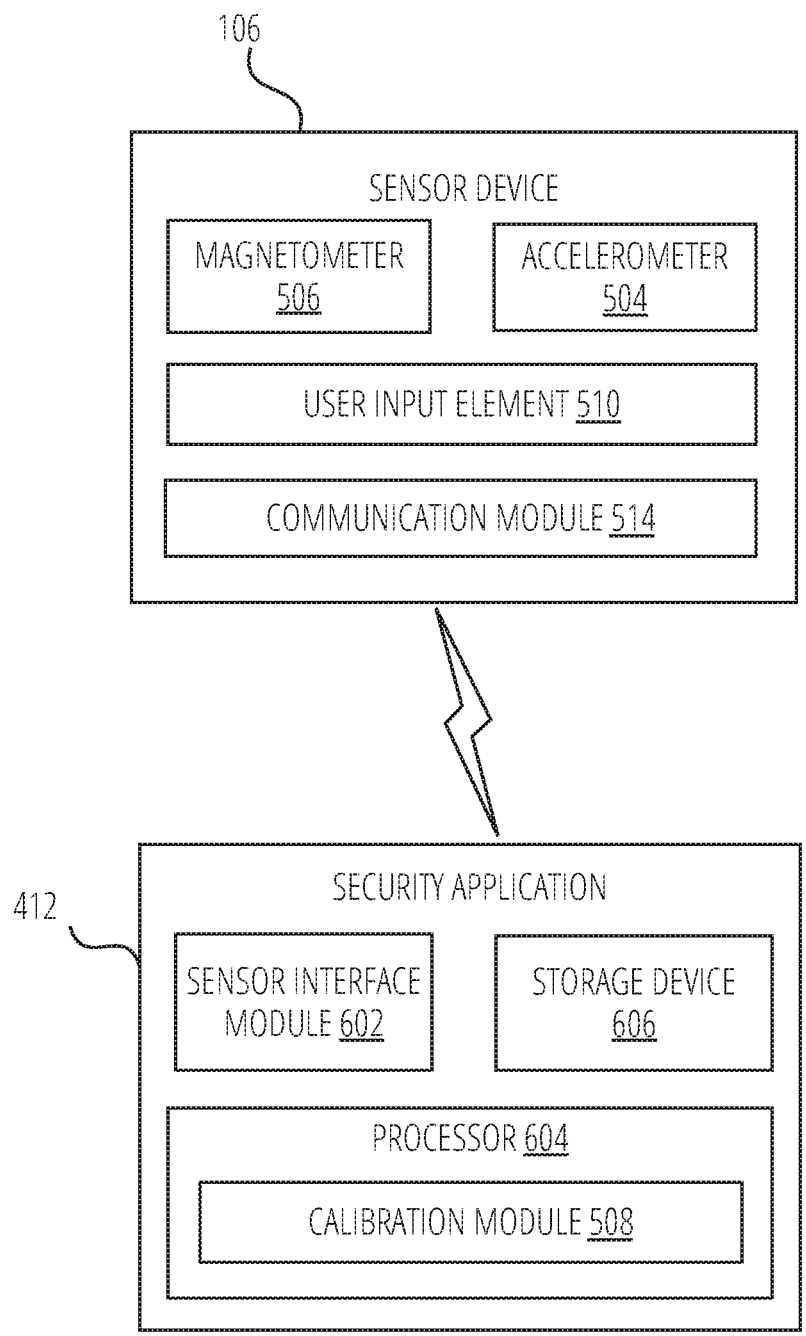
FIG. 6 illustrates a sensor device in communication with a security application in accordance with another example embodiment.

FIG. 6 illustrates another example embodiment of the sensor device 106 in communication with the security application 412 in accordance with one example embodiment. The sensor device 106 includes the magnetometer 506, the accelerometer 504, the user input element 510, and the communication module 514. The communication module 514 communicates with the security application 412.

In one example embodiment, the security application 412 includes a sensor interface module 602, a storage device 606, and a processor 604. The sensor interface module 602 communicates with the communication module 514 and accesses sensor data (e.g., magnetometer data, accelerometer data) from the magnetometer 506 and the accelerometer 504. The storage device 606 stores historical sensor data from the magnetometer 506 and the accelerometer 504.

The processor 604 includes a calibration module 508. The calibration module 508 determines whether the sensor device 106 is in an open or close position based on the magnetometer data and the accelerometer data. In one example, the calibration module 508 calibrates the sensor device 106 to the open and close position based on the magnetometer data and the accelerometer data. The calibration module 508 operates in a similar manner to the calibration module 508.

Figure 7:
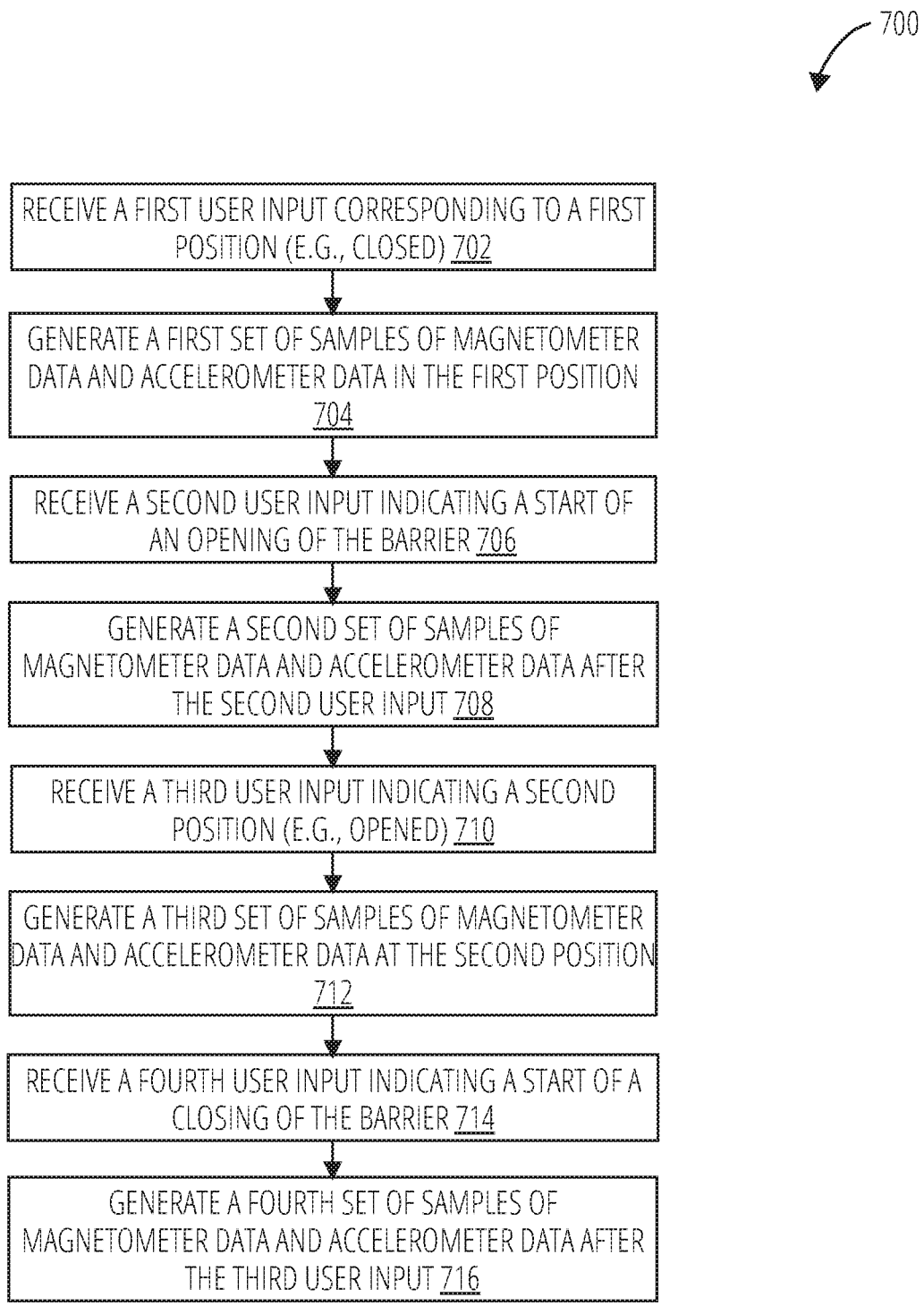
FIG. 7 illustrates a method for generating sample measurements in accordance with one example embodiment.

FIG. 7 illustrates a method 700 for recording sample vectors in accordance with one example embodiment. Operations in the method 700 may be performed by the sensor device 106, using components (e.g., modules, engines) described above with respect to FIG. 5. Accordingly, the method 700 is described by way of example with reference to the sensor device 106. However, it shall be appreciated that at least some of the operations of the method 700 may be deployed on various other hardware configurations or be performed by similar components residing elsewhere. For example, some of the operations may be performed at the security system 110.

At block 702, the sensor device 106 receives a first user input (e.g., first time powering the sensor device 106, or a user pressing on a button on the user input element 510 to identify a close position) corresponding to a first position (e.g., closed) of the window 102. At block 704, the magnetometer 506 and accelerometer 504 generate a first set of samples of magnetometer data and accelerometer data in the first position. At block 706, the sensor device 106 receives a second user input via the user input element 510. The second user input indicates that an installer is about to open the window 102. At block 708, the magnetometer 506 and accelerometer 504 generate a second set of samples of magnetometer data and accelerometer data after the second user input (e.g., while the window 102 is being opened). At block 710, the sensor device 106 receives a third user input via the user input element 510. The third user input indicates a second position (e.g., opened) of the window 102. At block 712, the magnetometer 506 and accelerometer 504 generate a third set of samples of magnetometer data and accelerometer data while the window 102 is at the second position. At block 714, the sensor device 106 receives a fourth user input indicating that the installer is about to close the window 102. At block 716, the magnetometer 506 and accelerometer 504 generate a fourth set of samples of magnetometer data and accelerometer data after the third user input.

Figure 8:
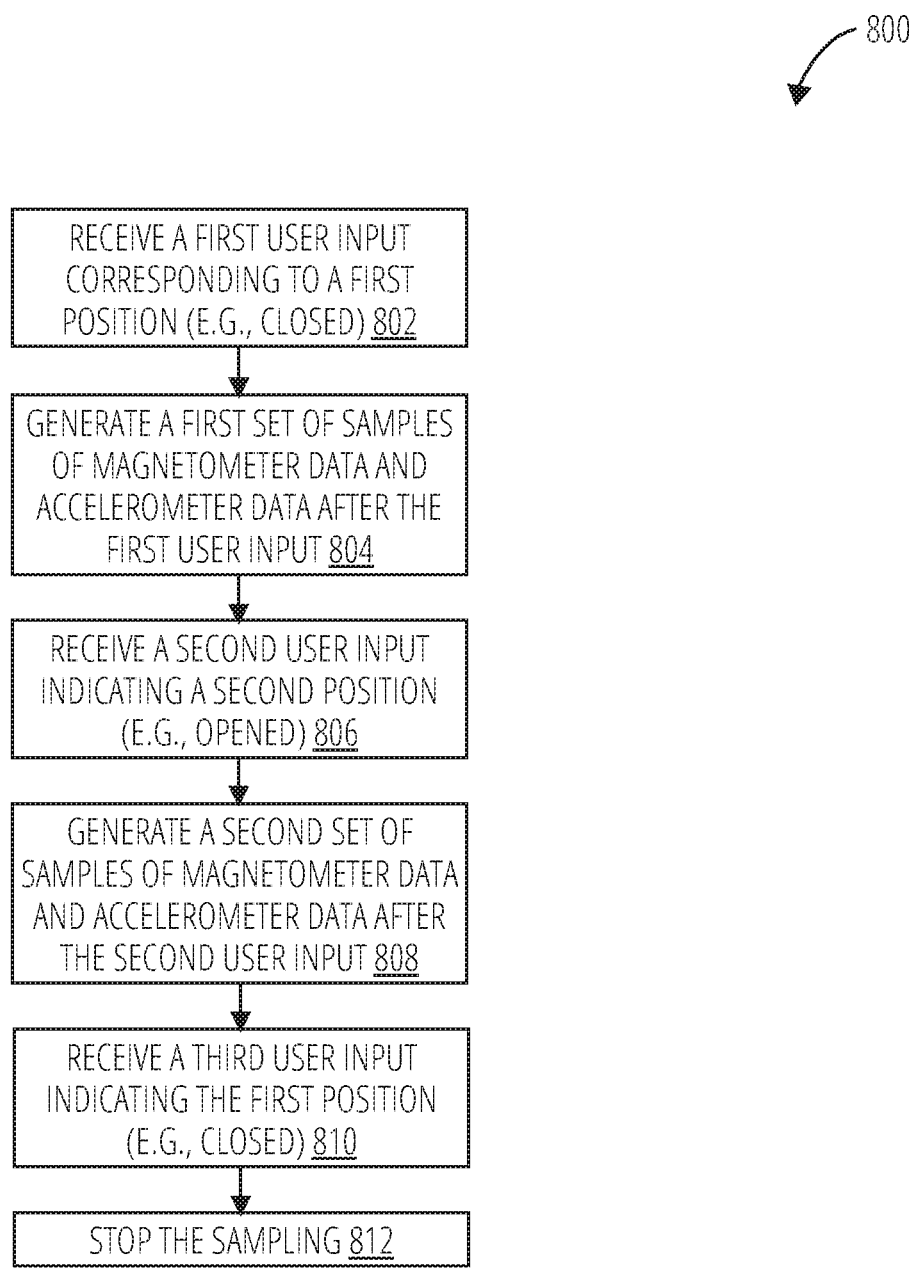
FIG. 8 illustrates a method for generating sample measurements in accordance with another example embodiment.

FIG. 8 illustrates a method for generating sample measurements in accordance with another example embodiment. Operations in the method 800 may be performed by the sensor device 106, using components (e.g., modules, engines) described above with respect to FIG. 5. Accordingly, the method 800 is described by way of example with reference to the sensor device 106. However, it shall be appreciated that at least some of the operations of the method 800 may be deployed on various other hardware configurations or be performed by similar components residing elsewhere. For example, some of the operations may be performed at the security system 110.

At block 802, the sensor device 106 receives, via the user input element 510, a first user input corresponding to a first position (e.g., closed) of the window 102. At block 804, the magnetometer 506 and accelerometer 504 generate a generate a first set of samples of magnetometer data and accelerometer data after the first user input. At block 806, the sensor device 106 receives via the user input element 510 a second user input indicating a second position (e.g., opened). At block 808, the magnetometer 506 and accelerometer 504 generate a second set of samples of magnetometer data and accelerometer data after the second user input (e.g., while the window 102 is being closed). At block 810, the sensor device 106 receives a third user input via the user input element 510. The third user input indicates that the window 102 is closed. At block 812, the sensor device 106 stops the sampling process.

Figure 9:
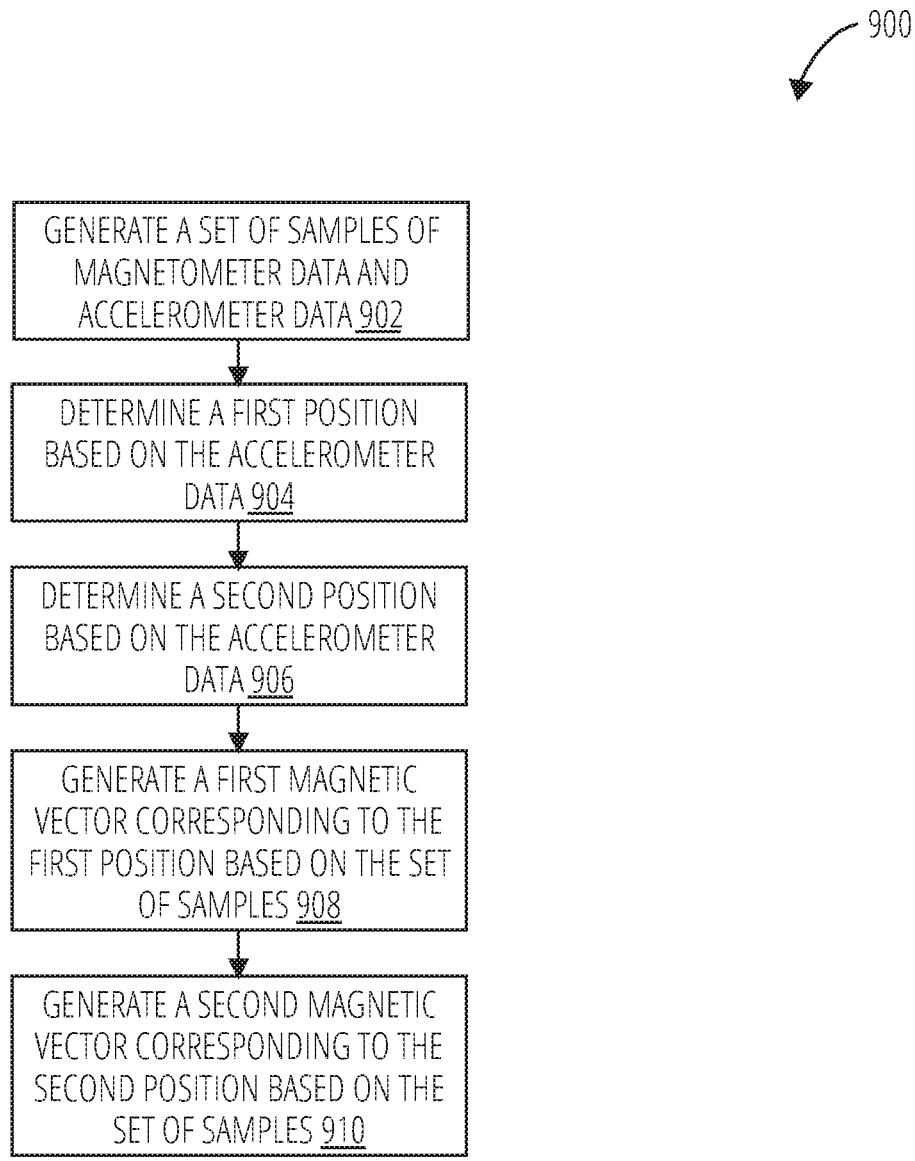
FIG. 9 illustrates a method for recording sample vectors in accordance with one example embodiment.

FIG. 9 illustrates a method for recording sample vectors in accordance with one example embodiment. Operations in the method 900 may be performed by the sensor device 106, using components (e.g., modules, engines) described above with respect to FIG. 5. Accordingly, the method 900 is described by way of example with reference to the sensor device 106. However, it shall be appreciated that at least some of the operations of the method 900 may be deployed on various other hardware configurations or be performed by similar components residing elsewhere. For example, some of the operations may be performed at the security system 110.

At block 902, the magnetometer 506 and accelerometer 504 generate a set of samples of magnetometer data and accelerometer data. At block 904, the calibration module 508 determines a first position (e.g., close) of the window 102 based on the accelerometer data (e.g., little or no acceleration detected). At block 906, the calibration module 508 determines a second position of the window 102 (e.g., open) based on the accelerometer data (e.g., acceleration detected). At block 908, the calibration module 508 generates a first magnetic vector corresponding to the first position based on the set of samples. At block 910, the calibration module 508 generates a second magnetic vector corresponding to the second position based on the set of samples.

Figure 10:
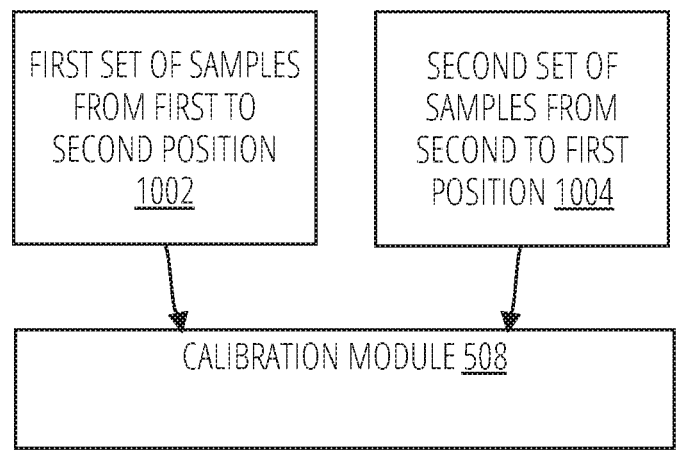
FIG. 10 illustrates a block diagram of an example operation of a calibration module in accordance with one embodiment.

FIG. 10 illustrates a block diagram of an example operation of a calibration module in accordance with one embodiment. The first set of samples from first to second position 1002 and second set of samples from second to first position 1004 are provided to the calibration module 508. The calibration module 508 determines the position of the window based on the first set of samples from first to second position 1002 and the second set of samples from second to first position 1004.

Figure 11:
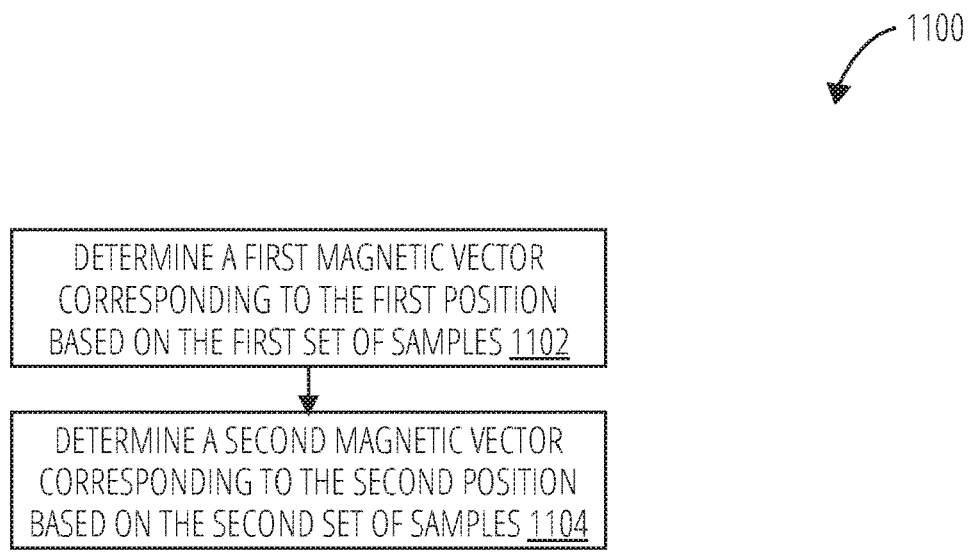
FIG. 11 illustrates a method for determining magnetic vectors at a first and a second position in accordance with one embodiment.

FIG. 11 illustrates a method for determining magnetic vectors at a first and a second position in accordance with one embodiment. Operations in the method 1100 may be performed by the sensor device 106, using components (e.g., modules, engines) described above with respect to FIG. 5. Accordingly, the method 1100 is described by way of example with reference to the sensor device 106. However, it shall be appreciated that at least some of the operations of the method 1100 may be deployed on various other hardware configurations or be performed by similar components residing elsewhere. For example, some of the operations may be performed at the security system 110.

At block 1102, the calibration module 508 determines a first magnetic vector corresponding to the first position of the window 102 based on the first set of samples from first to second position 1002. At block 1104, the calibration module 508 determines a second magnetic vector corresponding to the second position of the window 102 based on the second set of samples from second to first position 1004.

Figure 12:
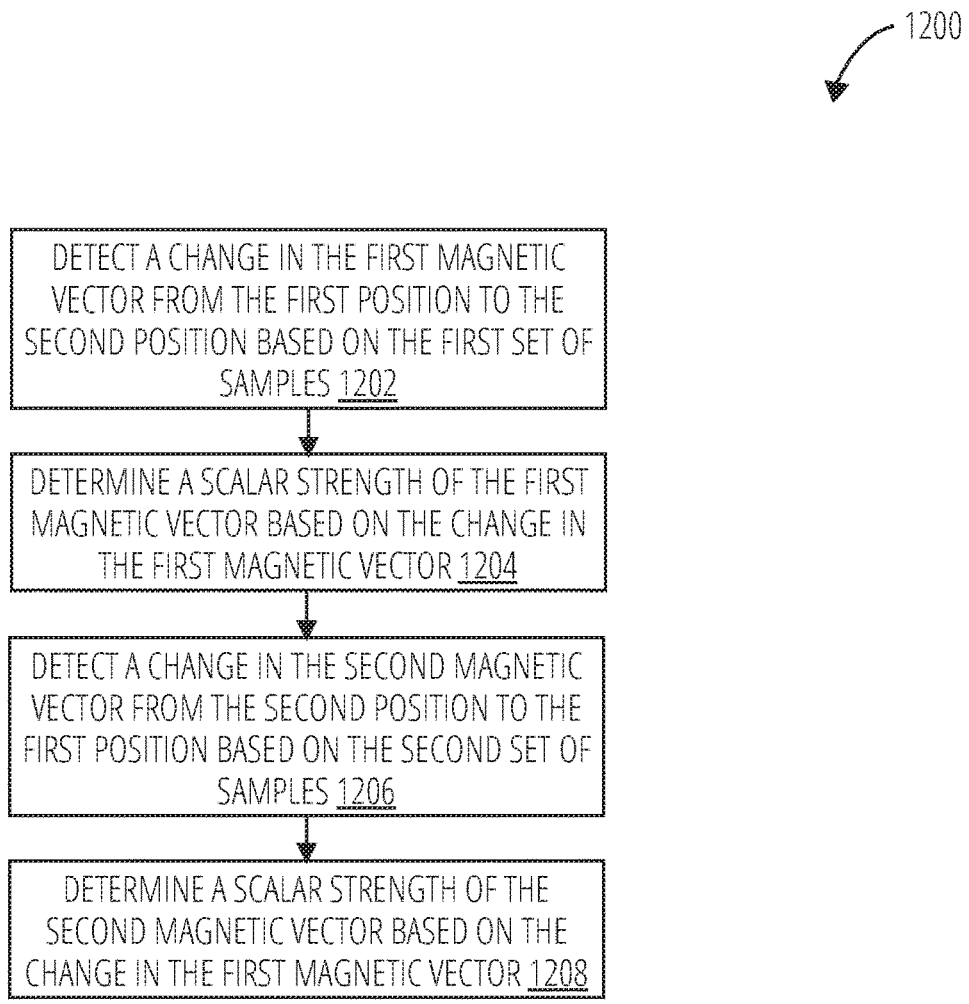
FIG. 12 illustrates a method for determining a change in the magnetic vectors in accordance with one embodiment.

FIG. 12 illustrates a method for determining a change in the magnetic vectors in accordance with one embodiment. Operations in the method 1200 may be performed by the sensor device 106, using components (e.g., modules, engines) described above with respect to FIG. 5. Accordingly, the method 1200 is described by way of example with reference to the sensor device 106. However, it shall be appreciated that at least some of the operations of the method 1200 may be deployed on various other hardware configurations or be performed by similar components residing elsewhere. For example, some of the operations may be performed at the security system 110.

At block 1202, the calibration module 508 detects a change in the first magnetic vector based on the first set of samples from first to second position 1002. At block 1204, the calibration module 508 determines a scalar strength of the first magnetic vector based on the change in the first magnetic vector. At block 1206, the calibration module 508 detect a change in the second set of samples from second to first position 1004 based on the second set of samples. At block 1208, the calibration module 508 determines a scalar strength of the second magnetic vector based on the change in the first magnetic vector.

Figure 13:
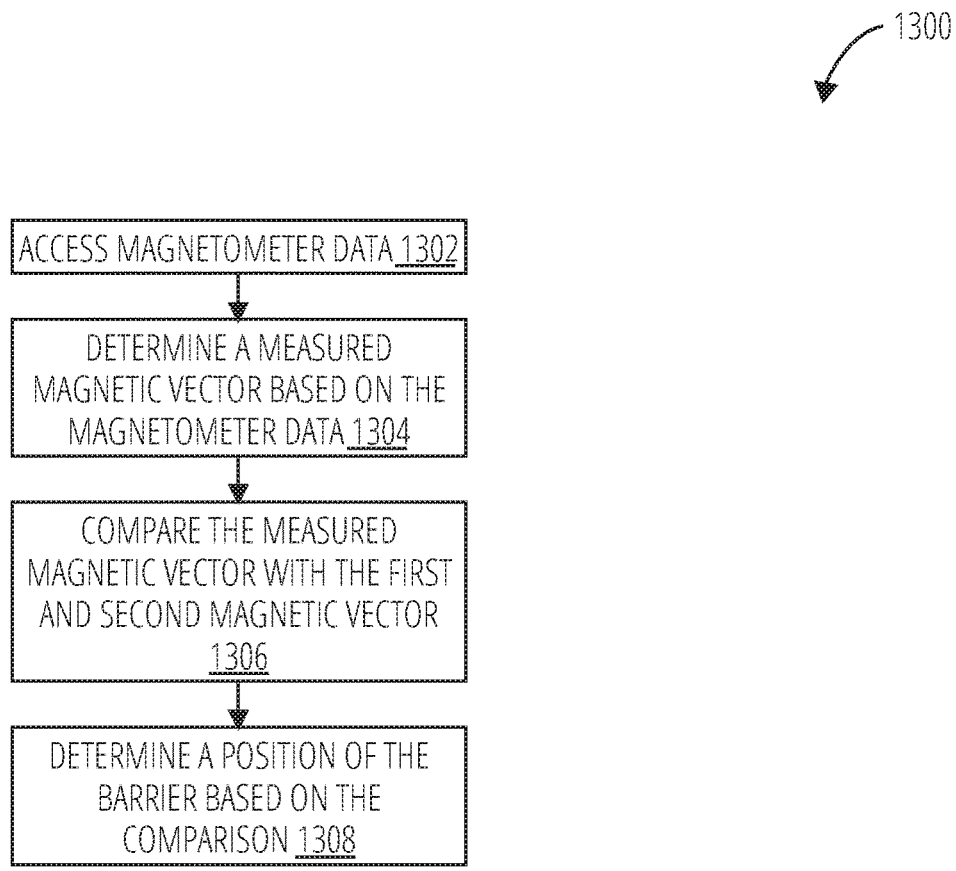
FIG. 13 illustrates a method for determining a position of a barrier based on the change in magnetic vectors in accordance with one embodiment.
Figure 14:
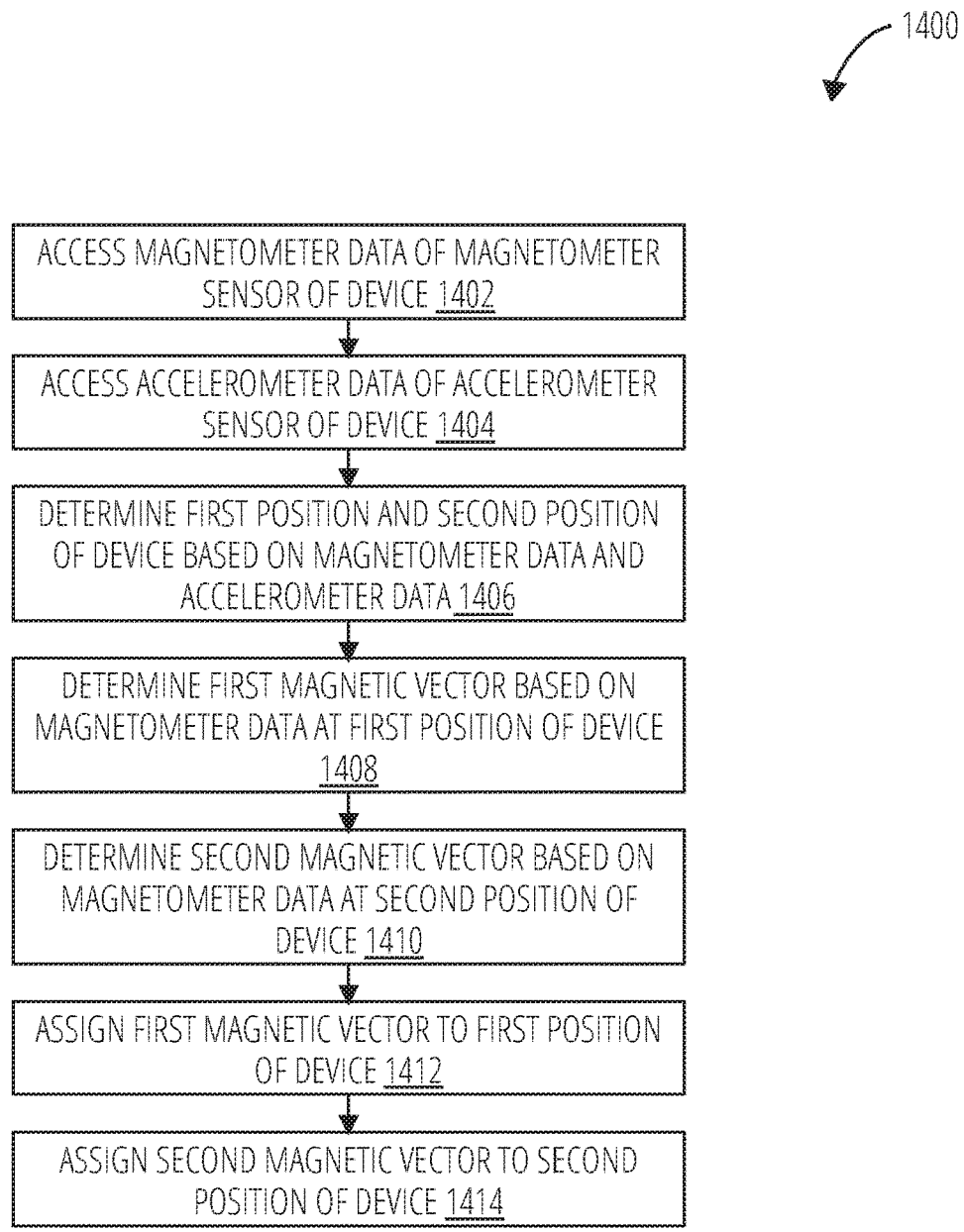
FIG. 14 illustrates a routine for calibrating a device in accordance with one embodiment.

FIG. 13 illustrates a method for determining a position of a barrier based on the change in magnetic vectors in accordance with one embodiment. Operations in the method 1300 may be performed by the sensor device 106, using components (e.g., modules, engines) described above with respect to FIG. 5. Accordingly, the method 1300 is described by way of example with reference to the sensor device 106. However, it shall be appreciated that at least some of the operations of the method 1300 may be deployed on various other hardware configurations or be performed by similar components residing elsewhere. For example, some of the operations may be performed at the security system 110.

At block 1302, the sensor device 106 accesses magnetometer data from the magnetometer 506. At block 1304, the sensor device 106 determines a measured magnetic vector based on the magnetometer data. At block 1306, the sensor device 106 compares the measured magnetic vector with the first and second magnetic vector. At block 1308, the sensor device 106 determines a position of the barrier (e.g., window) based on the comparison.

In block 1402, routine 1400 accesses magnetometer data of a magnetometer sensor of the device. In block 1404, routine 1400 accesses accelerometer data of an accelerometer sensor of the device. In block 1406, routine 1400 determines a first position and a second position of the device based on the magnetometer data and the accelerometer data. In block 1408, routine 1400 determines a first magnetic vector based on the magnetometer data at the first position of the device. In block 1410, routine 1400 determines a second magnetic vector based on the magnetometer data at the second position of the device. In block 1412, routine 1400 assigns the first magnetic vector to the first position of the device. In block 1414, routine 1400 assigns the second magnetic vector to the second position of the device.

Figure 15:
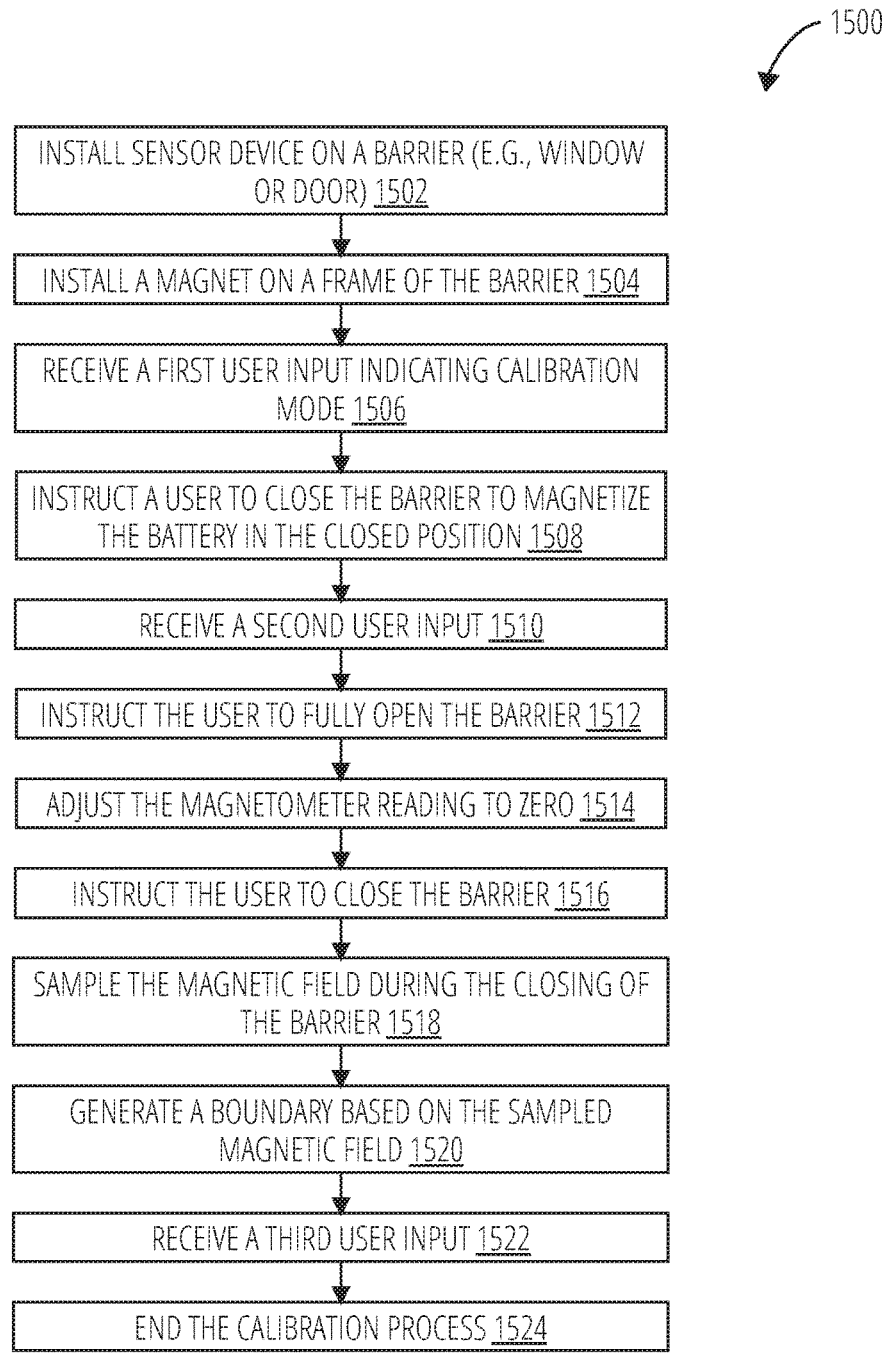
FIG. 15 illustrates a flow diagram of a method for calibrating a sensor device in accordance with one example embodiment.

FIG. 15 illustrates a flow diagram of a method 1500 for calibrating a sensor device in accordance with one example embodiment. At block 1502, a user mounts or installs the sensor device 106 on a barrier (e.g., a window or door). At block 1504, the magnet 108 is mounted to the frame 104 of the barrier. At block 1506, the sensor device 106 receives a first user input indicating a calibration mode. At block 1508, the user is instructed to close the barrier to magnetize the battery in the closed position. When the magnet 108 and battery 516 are close to each other, the magnet 108 magnetizes the battery 516.

At block 1510, the block 1602 receives a second user input. At block 1512, the user is instructed to fully open the barrier. At block 1514, the sensor device 106 adjusts or resets the magnetometer reading to zero. The sensor device 106 zeroes out the magnetic field that is remaining dues to earth's magnetic field and to the battery 516's magnetic field. In this state, from the sensor device 106 perspective, the magnitude of the magnetic field is zero.

At block 1516, the user is instructed to close the barrier. At block 1518, the sensor device 106 samples the magnetic field during the closing of the barrier. While the barrier closes, the magnetic field is sampled to obtain a sample of the normal magnetic field change over time that happens in a normal situation. At block 1520, the sensor device 106 generates a boundary based on the sampled magnetic field. The sampled magnetic field provides a subset of datapoints used to create a boundary around, that would serve to help detect with device tampering. For example, the boundary may be represented as a curve in 3D space represented by x,y,z magnitude. If the magnetic reading outside of this 3D boundary, the sensor device 106 can flag abnormal usage of the sensor device 106.

At block 1522, the sensor device 106 receives a third input device (when the barrier is fully closed). At block 1524, the calibration process ends.

Figure 16:
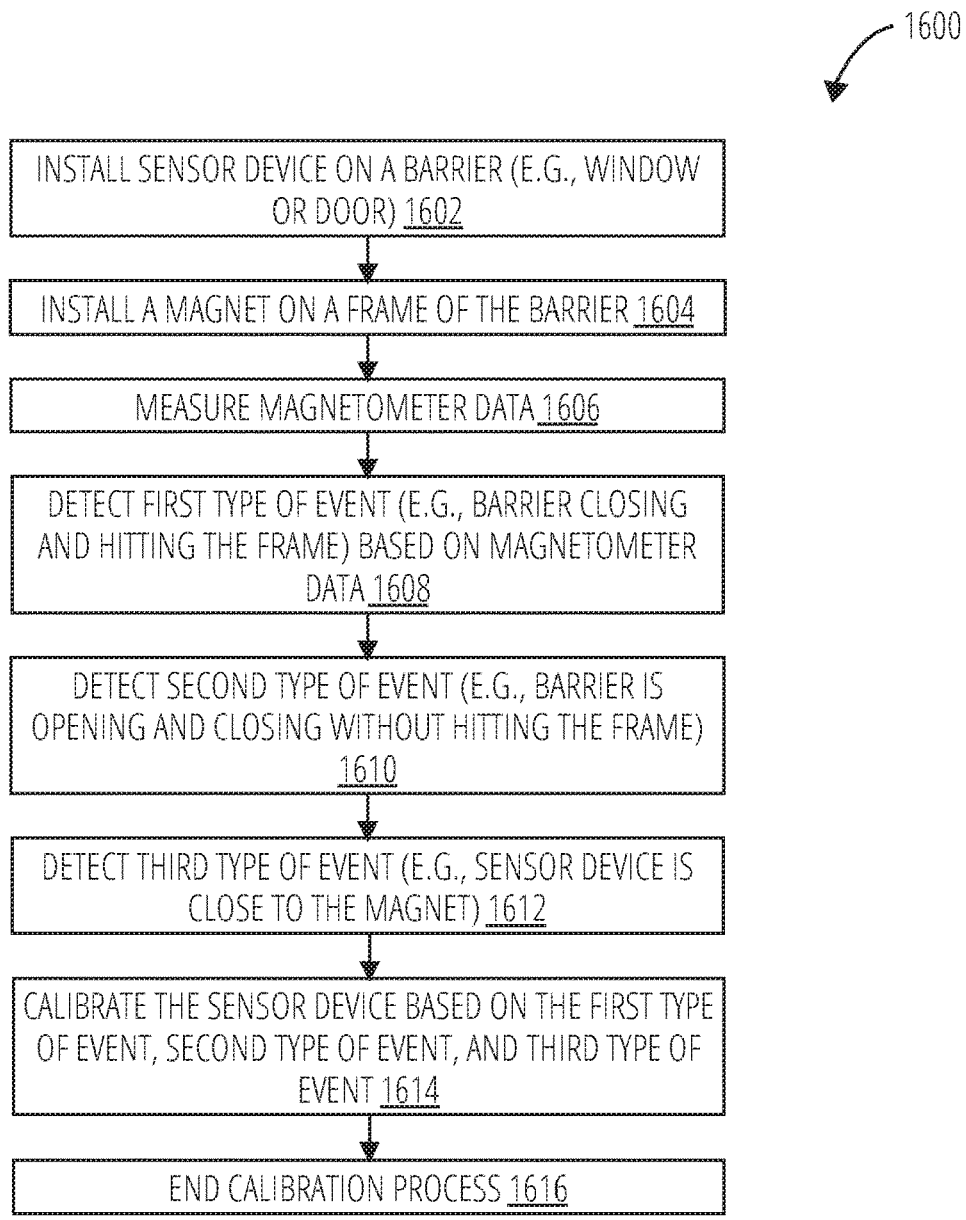
FIG. 16 illustrates a flow diagram of a method for calibrating a sensor device in accordance with another example embodiment.

FIG. 16 illustrates a flow diagram of a method 1600 for calibrating a sensor device in accordance with another example embodiment. At block 1602, a user mounts or installs the sensor device 106 on a barrier (e.g., a window or door). At block 1604, the magnet 108 is mounted to the frame 104 of the barrier. At block 1606, the sensor device 106 measures the magnetometer data. At block 1608, the sensor device 106 detects a first type of event (e.g., deceleration of the barrier hitting the frame 104 and the lock (if a door) engaging) based on the magnetometer data. At block 1610, the sensor device 106 detects a second type of event (e.g., barrier is opening and changing direction to close without hitting the frame). At block 1612, the sensor device 106 detects a third type of event (e.g., sensor device 106 is close the magnet 108). At block 1614, the calibration module 508 calibrates the sensor device 106 based on the first type of event, second type of event, and third type of event. At block 1616, the calibration process ends. Therefore, in the present example embodiment, a user input element 510 (e.g., calibration button) is not required. The calibration can be performed based on these automatic ways of knowing when the barrier is closed and opened.

Figure 17:
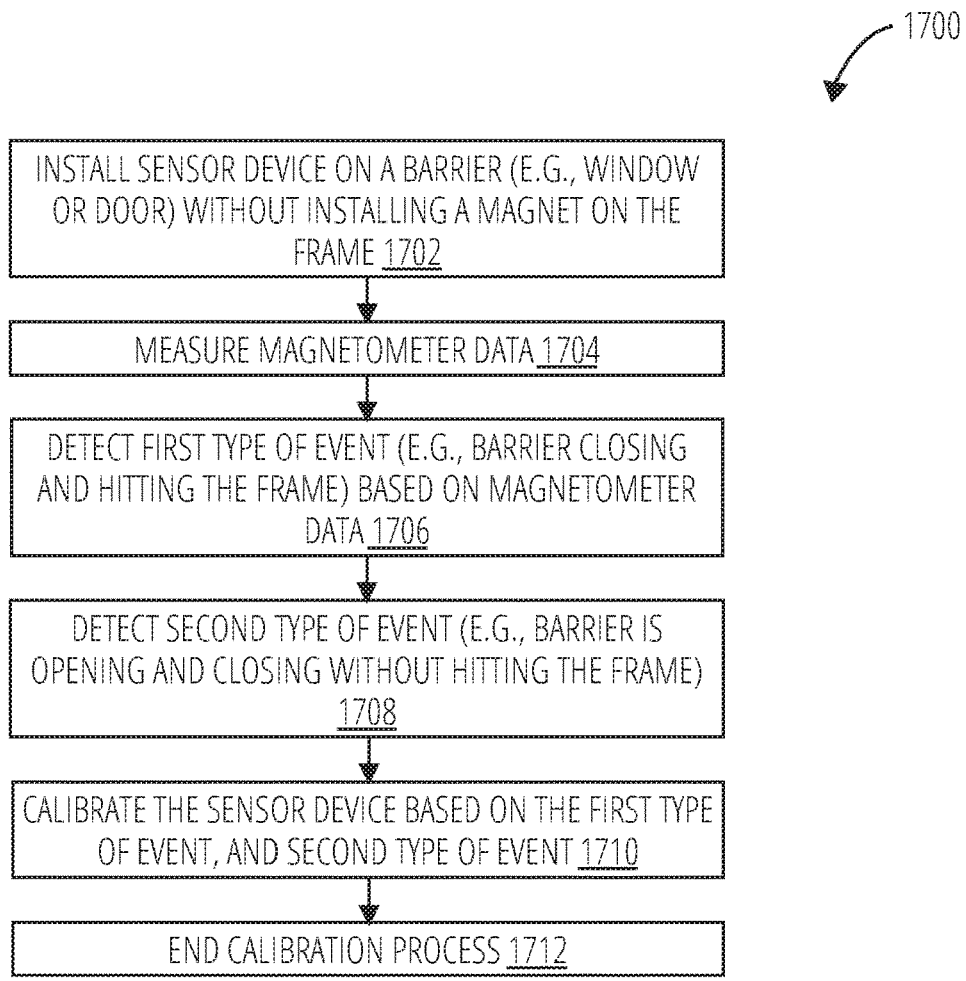
FIG. 17 illustrates a flow diagram of a method for calibrating a sensor device in accordance with another example embodiment.

FIG. 17 illustrates a flow diagram of a method 1700 for calibrating a sensor device in accordance with another example embodiment. At block 1702, a user mounts or installs the sensor device 106 on a barrier (e.g., a window or door). At block 1704, the sensor device 106 measures the magnetometer data. At block 1706, the sensor device 106 detects a first type of event (e.g., deceleration of the barrier hitting the frame 104 and the lock (if a door) engaging) based on the magnetometer data. At block 1708, the sensor device 106 detects a second type of event (e.g., barrier is opening and changing direction to close without hitting the frame). At block 1710, the calibration module 508 calibrates the sensor device 106 based on the first type of event, and the second type of event. At block 1712, the calibration process ends. Therefore, in the present example embodiment, a user input element 510 (e.g., calibration button) and the magnet 108 are not required.

With a magnetometer and accelerometer, the above techniques to sense when the door is opened and closed, and the magnetometer data are used, especially on a swinging barrier, to use the earth's magnetic field to know the angle of the barrier. In cross referencing these two different sensors, no magnet is required in swinging barrier situations.

Figure 18:
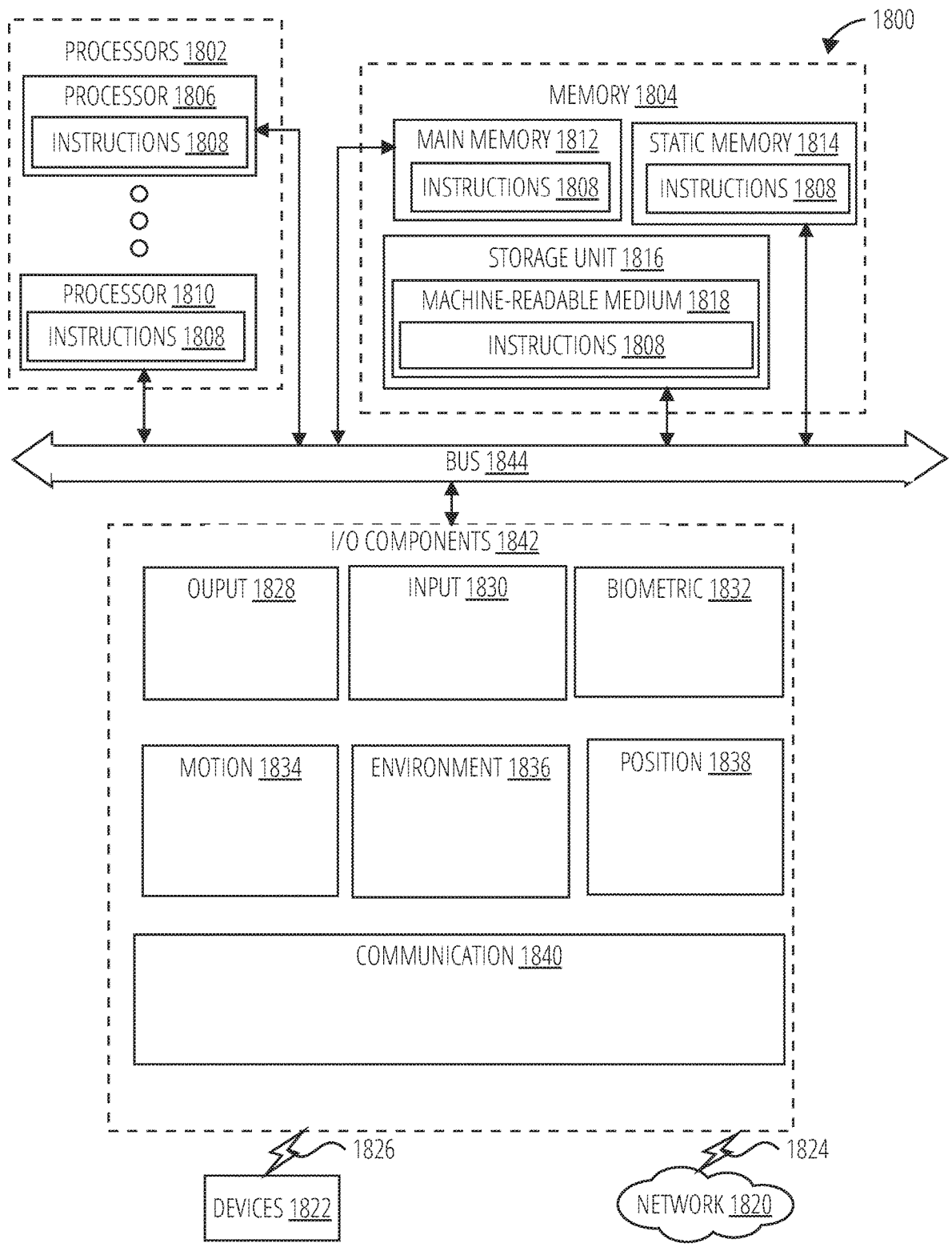
FIG. 18 is a diagrammatic representation of a machine in the form of a computer system within which a set of instructions may be executed for causing the machine to perform any one or more of the methodologies discussed herein, according to an example embodiment.

FIG. 18 is a diagrammatic representation of the machine 1800 within which instructions 1808 (e.g., software, a program, an application, an applet, an app, or other executable code) for causing the machine 1800 to perform any one or more of the methodologies discussed herein may be executed. For example, the instructions 1808 may cause the machine 1800 to execute any one or more of the methods described herein. The instructions 1808 transform the general, non-programmed machine 1800 into a particular machine 1800 programmed to carry out the described and illustrated functions in the manner described. The machine 1800 may operate as a standalone device or may be coupled (e.g., networked) to other machines. In a networked deployment, the machine 1800 may operate in the capacity of a server machine or a client machine in a server-client network environment, or as a peer machine in a peer-to-peer (or distributed) network environment. The machine 1800 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1808, sequentially or otherwise, that specify actions to be taken by the machine 1800. Further, while only a single machine 1800 is illustrated, the term "machine" shall also be taken to include a collection of machines that individually or jointly execute the instructions 1808 to perform any one or more of the methodologies discussed herein.

The machine 1800 may include processors 1802, memory 1804, and I/O components 1842, which may be configured to communicate with each other via a bus 1844. In an example embodiment, the processors 1802 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 1806 and a processor 1810 that execute the instructions 1808. The term "processor" is intended to include multi-core processors that may comprise two or more independent processors (sometimes referred to as "cores") that may execute instructions contemporaneously. Although FIG. 18 shows multiple processors 1802, the machine 1800 may include a single processor with a single core, a single processor with multiple cores (e.g., a multi-core processor), multiple processors with a single core, multiple processors with multiples cores, or any combination thereof.

The memory 1804 includes a main memory 1812, a static memory 1814, and a storage unit 1816, both accessible to the processors 1802 via the bus 1844. The main memory 1804, the static memory 1814, and storage unit 1816 store the instructions 1808 embodying any one or more of the methodologies or functions described herein. The instructions

1808 may also reside, completely or partially, within the main memory 1812, within the static memory 1814, within machine-readable medium 1818 within the storage unit 1816, within at least one of the processors 1802 (e.g., within the processor's cache memory), or any suitable combination thereof, during execution thereof by the machine 1800.

The I/O components 1842 may include a wide variety of components to receive input, provide output, produce output, transmit information, exchange information, capture measurements, and so on. The specific I/O components 1842 that are included in a particular machine will depend on the type of machine. For example, portable machines such as mobile phones may include a touch input device or other such input mechanisms, while a headless server machine will likely not include such a touch input device. It will be appreciated that the I/O components 1842 may include many other components that are not shown in FIG. 18. In various example embodiments, the I/O components 1842 may include output components 1828 and input components 1830. The output components 1828 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1830 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1842 may include biometric components 1832, motion components 1834, environmental components 1836, or position components 1838, among a wide array of other components. For example, the biometric components 1832 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1834 include acceleration sensor components (e.g., accelerometer), gravitation sensor components, rotation sensor components (e.g., gyroscope), and so forth. The environmental components 1836 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1838 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1842 further include communication components 1840 operable to couple the machine 1800 to a network 1820 or devices 1822 via a coupling 1824 and a coupling 1826, respectively. For example, the communication components 1840 may include a network interface component or another suitable device to interface with the network 1820. In further examples, the communication components 1840 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1822 may be another machine or any of a wide variety of peripheral devices (e.g., a peripheral device coupled via a USB).

Moreover, the communication components 1840 may detect identifiers or include components operable to detect identifiers. For example, the communication components 1840 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1840, such as location via Internet Protocol (IP) geolocation, location via Wi-Fi® signal triangulation, location via detecting an NFC beacon signal that may indicate a particular location, and so forth.

The various memories (e.g., memory 1804, main memory 1812, static memory 1814, and/or memory of the processors 1802) and/or storage unit 1816 may store one or more sets of instructions and data structures (e.g., software) embodying or used by any one or more of the methodologies or functions described herein. These instructions (e.g., the instructions 1808), when executed by processors 1802, cause various operations to implement the disclosed embodiments.

The instructions 1808 may be transmitted or received over the network 1820, using a transmission medium, via a network interface device (e.g., a network interface component included in the communication components 1840) and using any one of a number of well-known transfer protocols (e.g., hypertext transfer protocol (HTTP)). Similarly, the instructions 1808 may be transmitted or received using a transmission medium via the coupling 1826 (e.g., a peer-to-peer coupling) to the devices 1822.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for calibrating a device, the method comprising:
   receiving a first user input indicating a first position of the device;
   in response to receiving the first user input, starting a programming of the device by generating a first set of sample data by accessing first magnetometer data of a magnetometer sensor of the device and first accelerometer data of an accelerometer sensor of the device;
   assigning the first set of sample data to the first position of the device;
   receiving a second user input indicating a second position of the device after receiving the first user input;
   in response to receiving the second user input, generating a second set of sample data by accessing second magnetometer data and second accelerometer data of the device;
   assigning the second set of sample data to the second position of the device;
   receiving a third user input indicating the first position of the device after receiving the second user input indicating the second position of the device;
   in response to receiving the third user input, ending the programming of the device;
   determining a first magnetic field based on the magnetometer data of the first set of sample data in response to receiving the first user input at the first position of the device;
   determining a second magnetic field based on the magnetometer data of the second set of sample data in response to receiving the second input at the second position of the device;
   assigning the first magnetic field to the first position of the device; and
   assigning the second magnetic field to the second position of the device.

2. The method of claim 1, further comprising:
   accessing samples of magnetometer data and accelerometer data;
   determining a measured magnetic field based on the samples of magnetometer data and accelerometer data;
   comparing the measured magnetic field with the first magnetic field and the second magnetic field; and
   determining whether the device is in the first position or the second position based on the comparison.

3. The method of claim 1, wherein the first position of the device indicates a closed position and the second position of the device indicates an open position, or wherein the first position of the device indicates an open position and the second position of the device indicates a closed position, wherein the closed position is based on an analysis of shock data from the accelerometer sensor.

4. The method of claim 1, further comprising:
   determining that the first accelerometer data corresponds to a first accelerometer data pattern;
   identifying a first magnetic field reading after determining that the first accelerometer data corresponds to the first accelerometer data pattern; and
   assigning the first magnetic field reading to the first position, the first magnetic field being based on the first magnetic field reading.

5. The method of claim 1, further comprising:
   determining that the second accelerometer data corresponds to a second accelerometer data pattern after determining that the first accelerometer data corresponds to the first accelerometer data pattern;
   identifying a second magnetic field reading after determining that the second accelerometer data corresponds to the second accelerometer data pattern; and
   assigning the second magnetic field reading to the second position, the second magnetic field being based on the second magnetic field reading.

6. The method of claim 5, wherein the first accelerometer data pattern indicates a first acceleration, a first deceleration following the first acceleration, a first stop following the first deceleration,
   wherein the second accelerometer data pattern indicates a second acceleration, a second deceleration following the second acceleration, a second stop following the second deceleration,
   wherein the first deceleration indicates a substantially smooth deceleration, and
   wherein the second stop indicates an abrupt stop with residual vibrations.

7. The method of claim 1, further comprising:
   determining the first magnetic field at a beginning of the first set of sample data and an ending of the second set of sample data; and
   determining the second magnetic field at a beginning of the second set of sample data and an ending of the first set of sample data.

8. The method of claim 1, further comprising:
   determining a first acceleration vector based on the accelerometer data at the first position;

determining a second acceleration vector based on the accelerometer data at the second position;

assigning the first acceleration vector to a first tamper-free range corresponding to a position change from the first position; and assigning the second acceleration vector to a second tamper-free range corresponding to a position change from the second position.

9. The method of claim 1, further comprising:

sampling the accelerometer data;

determining whether the accelerometer data is within the first tamper-free range or the second tamper-free range; and determining that the position of the device is in the first position or the second position based on determining whether the accelerometer data is within the first tamper-free range or the second tamper-free range.

10. The method of claim 1, further comprising:

sampling the accelerometer data and the magnetometer data;

determining whether the device is in the first or second position based on the sampled accelerometer data and the magnetometer data; and storing information of the first magnetic field and the second magnetic field in a memory of the device.

11. A computing apparatus, the computing apparatus comprising:

a processor; and a memory storing instructions that, when executed by the processor, configure the apparatus to:

receive a first user input indicating a first position of the device;

in response to receiving the first user input, start a programming of the device by generating a first set of sample data by accessing first magnetometer data of a magnetometer sensor of the device and first accelerometer data of an accelerometer sensor of the device;

assign the first set of sample data to the first position of the device;

receive a second user input indicating a second position of the device after receiving the first user input;

in response to receiving the second user input, generate a second set of sample data by accessing second magnetometer data and second accelerometer data of the device;

assign the second set of sample data to the second position of the device;

receive a third user input indicating the first position of the device after receiving the second user input indicating the second position of the device;

in response to receiving the third user input, end the programming of the device;

determine a first magnetic field based on the magnetometer data of the first set of sample data in response to receiving the first user input at the first position of the device;

determine a second magnetic field based on the magnetometer data of the second set of sample data in response to receiving the second input at the second position of the device;

assign the first magnetic field to the first position of the device; and assign the second magnetic field to the second position of the device.

12. The computing apparatus of claim 11, wherein the instructions further configure the apparatus to:

access samples of magnetometer data and accelerometer data;

determine a measured magnetic field based on the samples of magnetometer data and accelerometer data;

compare the measured magnetic field with the first magnetic vector and the second magnetic vector; and determine whether the device is in the first position or the second position based on the comparison.

13. The computing apparatus of claim 11, wherein the first position of the device indicates a closed position and the second position of the device indicates an open position, or wherein the first position of the device indicates an open position and the second position of the device indicates a closed position, wherein the closed position is based on an analysis of shock data from the accelerometer sensor.

14. The computing apparatus of claim 11, wherein the instructions further configure the apparatus to:

determine that the first accelerometer data corresponds to a first accelerometer data pattern;

identify a first magnetic field reading after determining that the first accelerometer data corresponds to the first accelerometer data pattern; and assign the first magnetic field reading to the first position, the first magnetic field being based on the first magnetic field reading.

15. The computing apparatus of claim 11, wherein the instructions further configure the apparatus to:

determine that the second accelerometer data corresponds to a second accelerometer data pattern after determining that the first accelerometer data corresponds to the first accelerometer data pattern;

identify a second magnetic field reading after determining that the second accelerometer data corresponds to the second accelerometer data pattern; and assign the second magnetic field reading to the second position, the second magnetic field being based on the second magnetic field reading.

16. The computing apparatus of claim 15, wherein the first accelerometer data pattern indicates a first acceleration, a first deceleration following the first acceleration, a first stop following the first deceleration, wherein the second accelerometer data pattern indicates a second acceleration, a second deceleration follow the second acceleration, a second stop following the second deceleration, wherein the first deceleration indicates a substantially smooth deceleration, and wherein the second stop indicates an abrupt stop with residual vibrations.

17. The computing apparatus of claim 11, wherein the instructions further configure the apparatus to:

determine the first magnetic field at a beginning of the first set of sample data and an ending of the second set of sample data; and determine the second magnetic field at a beginning of the second set of sample data and an ending of the first set of sample data.

18. The computing apparatus of claim 11, wherein the instructions further configure the apparatus to:

determine a first acceleration vector based on the accelerometer data at the first position;

determine a second acceleration vector based on the accelerometer data at the second position;

assign the first acceleration vector to a first tamper-free range corresponding to a position change from the first position; and assign the second acceleration vector to a second tamper-free range corresponding to a position change from the second position.

19. The computing apparatus of claim 11, wherein the instructions further configure the apparatus to:
sample the accelerometer data;
determine whether the accelerometer data is within the first tamper-free range or the second tamper-free range; and
determine that the position of the device is in the first position or the second position based on determining whether the accelerometer data is within the first tamper-free range or the second tamper-free range.

20. A non-transitory computer-readable storage medium, the computer-readable storage medium including instructions that when executed by a computer, cause the computer to:
receive a first user input indicating a first position of the device;
in response to receiving the first user input, start a programming of the device by generating a first set of sample data by accessing first magnetometer data of a magnetometer sensor of the device and first accelerometer data of an accelerometer sensor of the device;
assign the first set of sample data to the first position of the device;
receive a second user input indicating a second position of the device after receiving the first user input;
in response to receiving the second user input, generate a second set of sample data by accessing second magnetometer data and second accelerometer data of the device;
assign the second set of sample data to the second position of the device;
receive a third user input indicating the first position of the device after receiving the second user input indicating the second position of the device;
in response to receiving the third user input, end the programming of the device;
determine a first magnetic field based on the magnetometer data of the first set of sample data in response to receiving the first user input at the first position of the device;
determine a second magnetic field based on the magnetometer data of the second set of sample data in response to receiving the second input at the second position of the device;
assign the first magnetic field to the first position of the device; and
assign the second magnetic field to the second position of the device.

* * * * *